(12) United States Patent
Mickan et al.

(10) Patent No.: US 7,713,665 B2
(45) Date of Patent: May 11, 2010

(54) LITHOGRAPHIC APPARATUS AND PATTERNING DEVICE

(75) Inventors: Uwe Mickan, Veldhoven (NL); Antonius Johannes Josephus Dijsseldonk, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 758 days.

(21) Appl. No.: 11/391,682

(22) Filed: Mar. 29, 2006

(65) Prior Publication Data

US 2007/0231709 A1    Oct. 4, 2007

(51) Int. Cl.
G03F 1/00 (2006.01)
H01L 21/00 (2006.01)
G03B 27/68 (2006.01)

(52) U.S. Cl. .............. 430/5; 355/52; 430/311
(58) Field of Classification Search .......... 430/5, 430/311; 716/19, 20, 21; 355/52, 53
See application file for complete search history.

(56) References Cited

U.S. PATENT DOCUMENTS

| | | | |
|---|---|---|---|
| 2004/0137677 A1* | 7/2004 | Lowisch et al. | 438/232 |
| 2004/0188383 A1* | 9/2004 | Lucas et al. | 216/54 |
| 2005/0102648 A1* | 5/2005 | Hsu et al. | 716/19 |
| 2006/0292456 A1* | 12/2006 | Baluswamy | 430/5 |

\* cited by examiner

*Primary Examiner*—Mark F Huff
*Assistant Examiner*—Jonathan Jelsma
(74) *Attorney, Agent, or Firm*—Pillsbury Winthrop Shaw Pittman, LLP

(57) ABSTRACT

A mask for a lithographic apparatus is disclosed, the mask having a patterned region bearing a pattern to be transferred onto a substrate and a border surrounding the patterned region, wherein at least part of the border has a plurality of elements, the dimensions of the elements being such that, during use, they would not be resolved at the substrate. Also, a lithographic apparatus is disclosed, the apparatus having a projection system, a substrate table arranged to hold a substrate, and a patterning device having a patterned region which bears a pattern to be transferred using a radiation beam via the projection system onto the substrate, at least part of a border surrounding the patterned region comprising a plurality of elements arranged to direct radiation onto the substrate, the dimensions of the elements such that, during use, they are not resolved at the substrate.

21 Claims, 3 Drawing Sheets

7,713,665 B2

LITHOGRAPHIC APPARATUS AND PATTERNING DEVICE

FIELD

The present invention relates to a lithographic apparatus and to a mask for a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

The pattern may be transferred from the patterning device to the substrate using a projection system comprising a series of optical elements. The optical elements may be transmissive or reflective, the choice between transmissive or reflective generally being based upon properties of the wavelength of radiation beam used. The pattern projected onto the substrate may suffer uniformity degradation due to flare caused by one or more optical elements of the projection system.

SUMMARY

It is desirable, for example, to provide a lithographic apparatus and/or mask which addresses the issue of flare.

According to an aspect of the invention, there is provided a mask for a lithographic apparatus, the mask comprising a patterned region bearing a pattern to be transferred onto a substrate; and a border surrounding the patterned region, wherein at least part of the border has a plurality of elements, the dimensions of the elements being such that, during use, they would not be resolved at the substrate.

According to an aspect of the invention, there is provided a lithographic apparatus, comprising a projection system, a substrate table arranged to hold a substrate, and a patterning device having a patterned region which bears a pattern to be transferred using a radiation beam via the projection system onto the substrate, at least part of a border surrounding the patterned region comprising a plurality of elements arranged to direct radiation onto the substrate, the dimensions of the elements such that, during use, they are not resolved at the substrate.

According to an aspect of the invention, there is provided a device manufacturing method, comprising exposing a patterned region and a plurality of elements on a border surrounding the patterned region to a radiation beam to form a patterned beam of radiation, wherein the dimensions of the elements are such that they are not resolved at a substrate and projecting the patterned beam of radiation onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
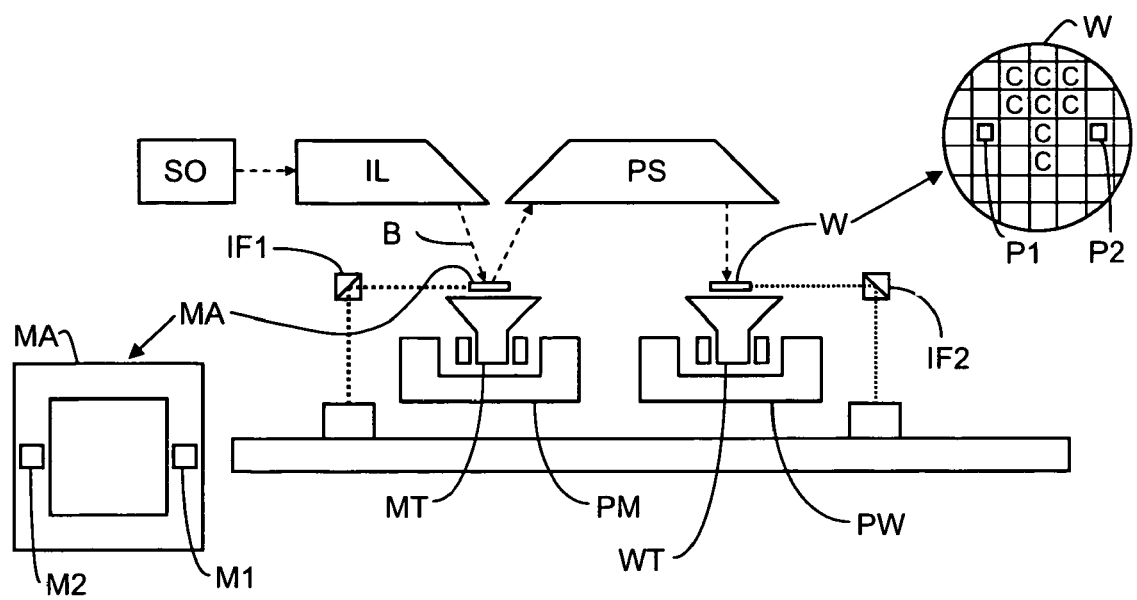
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation);

a support structure (e.g. a mask-table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A pattern projected by the projection system from the patterning device MA to the substrate W may suffer uniformity degradation due to flare caused by optical elements, such as lenses or mirrors, of the projection system. Taking as an example an embodiment of a projection system with a mirror, flare is typically caused by unevenness of the surface of the mirror of the projection system. Although the mirror is polished to a high accuracy, some unevenness will inevitably remain. The unevenness will include low spatial frequency components, intermediate spatial frequency components and high spatial frequency components. The intermediate spatial frequency components cause a type of flare which manifests itself as a disc of radiation on the substrate W, the disc having a radius of several millimeters.

Flare scales with wavelength, shorter wavelengths giving rise to greater flare. In addition, flare scales with the number of, for example, mirrors used in the projection system PS. For this reason, flare is of particular relevance to EUV lithographic apparatus. It will be appreciated however that flare may also be an issue in DUV lithographic apparatus, and the invention is not intended to be limited to only EUV lithographic apparatus.

Figure 2:
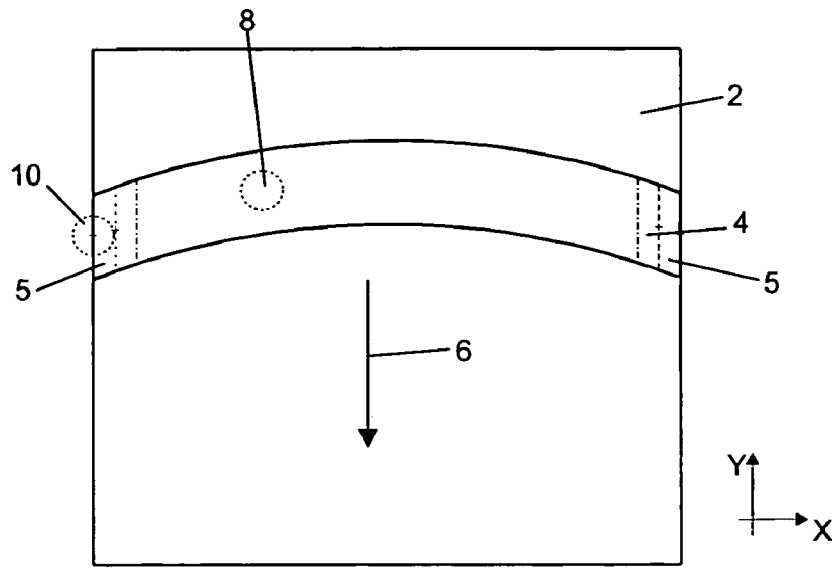
FIG. 2 shows schematically a slit of radiation generated by the lithographic apparatus.

FIG. 2 shows schematically a view, from above, of a target portion 2 of a substrate onto which a pattern is to be imaged by the lithographic apparatus of FIG. 1. The lithographic apparatus operates in scan mode (described further above), such that a slit of radiation 4 scans over the target portion 2, the slit moving in the direction of arrow 6.

As described above, unevenness of one or more mirrors of the projection system will give rise to flare, which will be present in the slit of radiation 4. In general, the flare will be evenly distributed across the slit of radiation 4. An example of a disc of flare radiation 8 is shown schematically. Typically, the disc of flare radiation may be approximately 2 mm in radius. Many overlapping discs of flare radiation are present in the slit 4, with the result that the flare radiation provides a uniform background radiation within the slit 4. Since the flare radiation is uniform, resist provided on a substrate for exposure by the projected radiation may be selected such that it takes into account the background flare radiation (i.e. such that the resist is not overexposed due to the background flare radiation). Thus, although in an ideal apparatus flare radiation would not be present, it can nevertheless be taken into account in a relatively straightforward manner since it has a constant intensity within the slit 4.

A problem arises at an edge of the slit 4 because the flare radiation is no longer constant. This is because towards an edge 5 of the slit, the disc of flare radiation becomes partially masked. A partially masked disc of radiation 10 is shown in FIG. 2.

Figure 3:
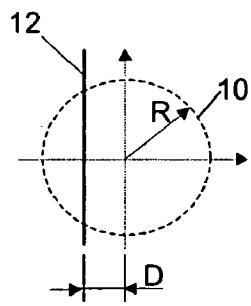
FIG. 3 is a schematic illustration of flare radiation.
Figure 4:
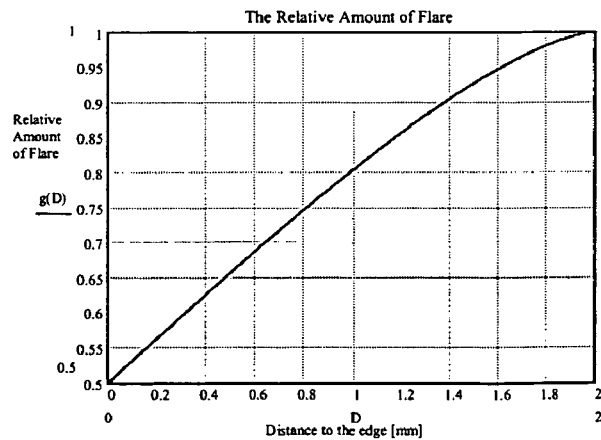
FIG. 4 is a graph depicting a decay of flare.

FIG. 3 shows in more detail a disc of flare radiation 10 which is partially masked at an edge of the slit. The distance between a center point of the disc 10 and an edge 12 of the slit is labeled as D, and the radius of the disc of flare radiation is labeled as R. Due to the masking effect, the amount of flare radiation at the edges 5 of the slit 4 (see FIG. 2) which are transverse to the direction of motion of the slit is reduced. Referring to FIG. 4, the relative amount of flare radiation in a region close to an edge 5 of the slit 4 can be seen to fall gradually to 50% over a distance of 2 mm (this assumes that the disc of flare radiation has a radius of 2 mm). The data shown in FIG. 4 assumes that 4 decades of energy are distributed within the 2 mm radius of the disc of flare radiation. Although the flare radiation has been described as being in the form of a disc, it will be appreciated that this has been done for ease of illustration only, and that in practice the flare radiation will have an energy distribution which decays outwardly from a central point (i.e. the flare radiation does not have a uniform intensity over its diameter). Typically, the energy distribution can be described by a power spectral density in which energy is distributed over around 5 decades on a logarithmic scale (assuming a 6 mirror EUV system with a magnification ratio of 4:1 and a mirror structure size of 250 nanometers).

As described above, the amount of flare radiation provided at an edge 5 of the slit 4 is not constant, but instead reduces as the edge 5 of the slit 4 is approached. The result of this drop off of flare radiation intensity is that the level of background radiation is reduced in the edge 5 region of the exposure slit 4. This in turn will mean that resist which is exposed at an edge 5 of the exposure slit 4 will tend to be underexposed. This may adversely affect the uniformity of the projected pattern which has been exposed at an edge 5 of the projection slit 4.

Figure 5:
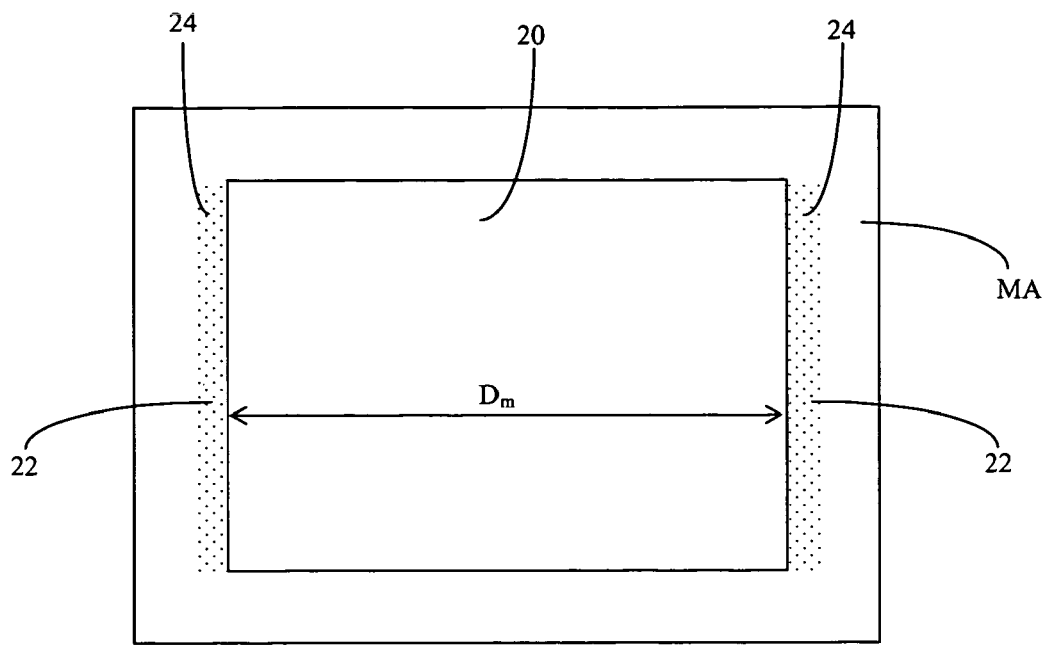
FIG. 5 shows schematically a mask according to an embodiment of the invention.

This problem may be addressed by modifying the patterning device MA (see FIG. 1) which is used to pattern the beam of radiation. Referring to FIG. 5, an example patterning device MA for an EUV lithographic apparatus comprises a mask having a quartz substrate having a patterned region 20 formed from a combination of reflective portions arranged to reflect EUV radiation and absorptive portions arranged to absorb EUV radiation. A border 22 of the mask MA is provided with absorptive material which absorbs the EUV radiation. The patterned region 20 of the mask MA has a width $D_m$ which corresponds to the width of the exposure slit 4 that is illuminated on the substrate W. In a conventional mask, the border 22 surrounding the patterned region 20 does not reflect a significant amount of radiation. However, in an embodiment of the invention, reflective elements 24 are provided in the border 22 next to the patterned region 20. The reflective elements 24 are sufficiently small that they are sub-resolution, i.e. they are not resolved, during exposure, at the substrate W. For example, in an EUV system, the reflective elements may be less than 80 nanometers across (assuming that the EUV lithographic apparatus has a magnification ratio of 4:1). It will be appreciated that for different lithographic apparatus a different maximum size of the reflective element may be possible, the size being such that it is not resolved on the substrate. The maximum size depends upon the resolution limit of the lithographic apparatus, which in turn depends upon the numerical aperture of the projection system and the wavelength used by the lithographic apparatus.

The density of the reflective elements is selected such that they provide sufficient radiation to generate flare radiation which substantially compensates for the reduction in flare radiation at an edge 5 of the exposure slit 4. In other words, the density of the reflective elements is selected such that the background radiation generated due to flare is constant across the width of the exposure slit 4. It is not necessary that the density of the reflective portions varies as a function of distance from the edge of the patterned region 20, a fixed density should provide the necessary compensation.

Figure 6:
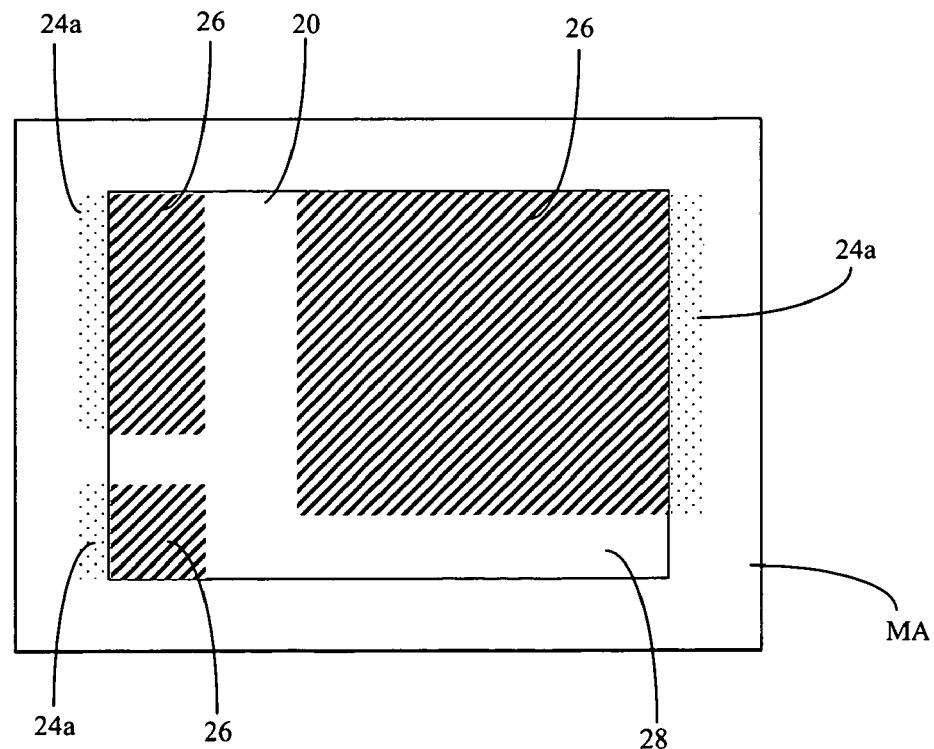
FIG. 6 shows schematically an alternative mask according to an embodiment of the invention.

The embodiment shown in FIG. 5 assumes that the patterned region 20 of the mask MA comprises a pattern which has a uniform density. However, often this is not the case. For example, FIG. 6 shows a mask MA having a patterned region 20 comprising three areas 26 of patterns, and an area 28 which is not patterned. It will be appreciated that in the area 28 which is not patterned there will be little or no flare radiation, since no radiation is reflected at this area. For this reason, reflective elements 24a on the mask MA are only provided in the border 22 next to those areas of the patterned region 20 which bear a pattern 26. If reflective elements 24 were to be provided next to the unpatterned area 28 they would cause unwanted flare to occur in that area.

The above embodiments have been described in relation to a lithographic apparatus comprising a reflective patterning device. However, it will be appreciated that the invention may be applied to a transmissive patterning device. Where this is done, instead of providing reflective elements in the patterning device, transmissive elements are provided. The transmissive elements may, for example, be pin holes in the transmissive patterning device. Similarly, it will be appreciated that one or more embodiments of the invention may be applied to other patterning devices, for example a programmable mirror array.

Although specific reference may be made in this text to the use of lithographic apparatus-in the manufacture of ICs, it should-be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A reflective mask for a lithographic apparatus, the reflective mask comprising:
   a patterned region bearing a pattern to be transferred onto a substrate, the patterned region comprising reflective portions arranged to reflect radiation, and absorptive portions arranged to absorb the radiation; and
   a border surrounding the patterned region, wherein at least part of the border has a plurality of reflective elements, the dimensions of the reflective elements being such that, during use, the reflective elements would not be resolved at the substrate, wherein the density of the reflective elements is such that, in use, the reflective elements generate flare radiation which substantially compensates for a reduction of flare radiation adjacent to a transverse edge of an exposure slit during use in a lithographic apparatus.

2. The mask of claim 1, wherein the reflective elements are less than 80 nanometers across.

3. The mask of claim 1, wherein an area of the patterned region is not provided with a pattern and the border of the patterned region next to that area is not provided with one or more of the reflective elements.

4. The mask of claim 1, wherein the reflective elements are provided only in that part of the border which is intended to be illuminated by the transverse edge of the exposure slit during use in the lithographic apparatus.

5. A lithographic apparatus, comprising:
   a projection system;
   a substrate table arranged to hold a substrate; and
   a patterning device having a patterned region which bears a pattern to be transferred using a radiation beam via the projection system onto the substrate, the patterned region comprising reflective portions arranged to reflect radiation, and absorptive portions arranged to absorb the radiation, at least part of a border surrounding the patterned region comprising a plurality of reflective elements arranged to direct radiation onto the substrate, the dimensions of the reflective elements being such that, during use, the reflective elements are not resolved at the substrate, wherein the density of the reflective elements is such that, in use, the reflective elements generate flare radiation which substantially compensates for a reduction of flare radiation adjacent to a transverse edge of an exposure slit during use in the lithographic apparatus.

6. The apparatus of claim 5, wherein the patterning device is a mask.

7. The apparatus of claim 6, wherein the mask is a reflective mask.

8. The apparatus of claim 6, wherein the reflective elements are less than 80 nanometers across.

9. The apparatus of claim 6, wherein an area of the patterned region is not provided with a pattern and the border of the patterned region next to that area is not provided with one or more of the reflective elements.

10. The apparatus of claim 5, wherein the patterning device is a programmable mirror array.

11. The apparatus of claim 5, wherein the reflective elements are provided only in that part of the border which is intended to be illuminated by the transverse edge of the exposure slit during use.

12. A device manufacturing method, comprising:
   exposing a patterned region comprising reflective portions arranged to reflect radiation, and absorptive portions arranged to absorb the radiation, and a plurality of reflective elements on a border surrounding the patterned region to a radiation beam to form a patterned beam of radiation, wherein the dimensions of the reflective elements are such that the reflective elements are not resolved at a substrate and the density of the reflective elements is such that the reflective elements generate flare radiation which substantially compensates for a reduction of flare radiation adjacent to a transverse edge of an exposure slit of the radiation beam; and
   projecting the patterned beam of radiation onto a substrate.

13. The method of claim 12, wherein the reflective elements are less than 80 nanometers across.

14. The method of claim 12, wherein an area of the patterned region is not provided with a pattern and the border of the patterned region next to that area is not provided with one or more of the reflective elements.

15. The method of claim 12, wherein the reflective elements are provided only in that part of the border illuminated by the transverse edge of the exposure slit of the radiation beam.

16. The mask of claim 1, wherein the radiation is EUV radiation.

17. the mask of claim 16, wherein the EUV radiation has a wavelength in the range of between 5 nm and 20 nm.

18. The apparatus of claim 5, wherein the radiation is EUV radiation.

19. The apparatus of claim 18, wherein the EUV radiation has a wavelength in the range of between 5 nm and 20 nm.

20. The method of claim 12, wherein the radiation is EUV radiation.

21. The method of claim 20, wherein the EUV radiation has a wavelength in the range of between 5 nm and 20 nm.

* * * * *